Figure 1:
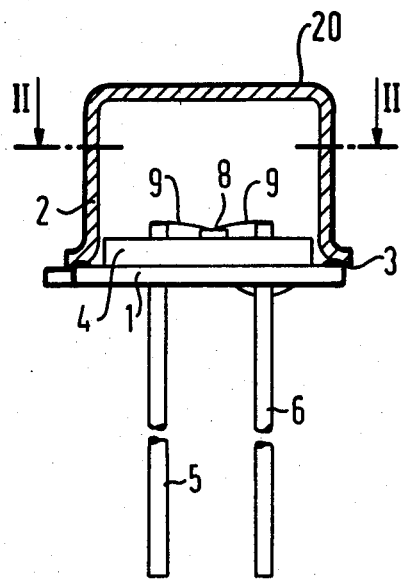

United States Patent

Dathe

[11] 4,375,008
[45] Feb. 22, 1983

[54] METHOD FOR ENCAPSULATING COMPONENTS WITH CASES AND AN ENCAPSULATION PROVIDED BY THE METHOD

[75] Inventor: Joachim Dathe, Munich, Fed. Rep. of Germany

[73] Assignee: Siemens Aktiengesellschaft, Berlin and Munich, Fed. Rep. of Germany

[21] Appl. No.: 144,024

[22] Filed: Apr. 28, 1980

[30] Foreign Application Priority Data

May 4, 1979 [DE] Fed. Rep. of Germany ....... 2918106

[51] Int. Cl.³ .................. H05K 5/06; H01R 43/00
[52] U.S. Cl. .................................. 174/17.05; 29/855;
29/588; 228/220; 228/221; 228/231; 174/52 H
[58] Field of Search ............... 228/220, 221, 188, 231;
357/80, 81, 79; 29/588, 855; 428/620, 621;
174/52 FP, 17.05, 52 H

[56] References Cited

U.S. PATENT DOCUMENTS

| 3,188,720 | 6/1965 | Husni, Jr. ............. | 228/188 X |
| 3,271,625 | 9/1966 | Caracciolo ........... | 174/52 FP |
| 3,340,602 | 9/1967 | Hontz .................. | 228/220 X |
| 3,743,895 | 7/1973 | Klunker et al. ...... | 357/81 X |

OTHER PUBLICATIONS

Amer. Soc. for Metals, Metals Handbook, (1948 Ed.), p. 1151.
Hydrogen in Metals, (1948), by Donald P. Smith.

*Primary Examiner*—Carl E. Hall
*Assistant Examiner*—Carl J. Arbes
*Attorney, Agent, or Firm*—Herbert L. Lerner; Laurence A. Greenberg

[57] ABSTRACT

Method for encapsulating components in cases, which includes connecting a gold wire to an aluminum surface, subsequently closing the case by welding in a vacuum, and tempering the case in a hydrogen-containing atmosphere and an encapsulation produced by the method.

12 Claims, 2 Drawing Figures

METHOD FOR ENCAPSULATING COMPONENTS WITH CASES AND AN ENCAPSULATION PROVIDED BY THE METHOD

The invention relates to a method for encapsulating components in cases, wherein a gold wire is connected to an aluminum surface, and an encapsulation produced by the method.

It has been pointed out already that the formation of undesired inter-metallic gold-aluminum-phases or interaction in components, where a gold wire is connected to an aluminum surface, can be greatly reduced if hydrogen is used as the surrounding atmosphere during the temperature or heat treatments of the component. But in the conventional manufacturing methods, the welding of metal cases or metal-ceramic cases in a pure hydrogen atmosphere is difficult to perform.

Therefore, the heat treatment in hydrogen furnaces was performed up to now with open cases only. Until this time, cases filled with hydrogen have not been known.

The gold-aluminum-phases could therefore only be avoided heretofore if aluminum-aluminum or gold-gold connections were used with the disadvantages associated therewith.

It is accordingly an object of the invention to provide a method for encapsulating components with cases and an encapsulation produced by the method, which overcomes the hereinafore-mentioned disadvantages of the heretofore-known methods and devices of this genral type, wherein a gold wire can be connected to an aluminum surface without the undesired formation of an intermetallic-gold-aluminum-phase.

With the foregoing an other objects in view there is provided, in accordance with the invention, a method for encapsulating components in cases, which comprises connecting a gold wire to an aluminum surface, subsequently closing the case by welding a seam in a vacuum, and tempering the case in a hydrogen-containing atmosphere.

According to the invention the component in which a gold wire is connected to an aluminum surface is first placed into a case. Then the case is closed by welding in a vacuum with a partial-pressure less than $10^{-2}$ Torr. Therefore preferably nickel, or a nickel-compound (55 . . . 60%, Cu, 12 . . . 26% Ni, 19 . . . 31% Zn) is used, whereby, however, nickel has a hydrogen-permeability which is approximately 50 times greater.

By tempering the welded case in a hydrogen-containing atmosphere at 150° to 350° C., hydrogen is diffused into the case in a sufficient amount, for example, until an inner pressure of hydrogen of 0.1 to 0.5 atm inside the case is reached.

To prevent the hydrogen from diffusing out of the case if the case is heated later in an atmosphere or environment which is hydrogen-free, or hydrogen-poor, in accordance with another mode of the invention, there is provided a method which comprises disposing a hydrogen barrier layer on the case. Since copper and tin have a very low permeability for hydrogen, a copper-tin double layer, which is, for example, produced galvanically, is particularly advantageous as a barrier layer for hydrogen. Therefore, in accordance with a further mode of the invention, there is provided a method which comprises forming the hydrogen barrier layer out of at least one of copper and tin.

In accordance with an added mode of the invention, there is provided a method which comprises forming the barrier layer with a thickness of from 2 to 4 $\mu$m copper and from 6 to 10 $\mu$m tin.

The hydrogen-barrier layer can be omitted if the material of the case has a low hydrogen permeability at the highest permissible temperature for the component, which applies, for example for nickel-compound, copper and aluminum, so that the maximally-required inside hydrogen pressure in the case is maintained during the total expected lifetime of the component. Therefore, in accordance with an additional mode of the invention, there is provided a method which comprises forming the case out of a material with a low hydrogen permeability at the maximal temperature permitted for the component. In this case the diffusion of hydrogen into the case must be performed at a correspondingly higher temperature, or for a longer time, than for cases made of nickel, for example.

In accordance with yet another mode of the invention, there is provided a method which comprises forming the case of one of the group consisting of nickel-compound, copper and aluminum or nickel. If the case can already be filled with hydrogen at the closing operation, which is possible in a friction-welding or soldering process, for example, then the hydrogen-barrier layer is also necessary, unless cases are used which themselves have a sufficient capability of blocking hydrogen.

In accordance with yet a further mode of the invention, there is provided a method which comprises adjusting the vacuum to less than $10^{-2}$ Torr.

In accordance with yet an added mode of the invention, there is provided a method which comprises adjusting the temperature during tempering to between 150° and 350° C.

In accordance with yet an additional mode of the invention, there is provided a method which comprises discontinuing the tempering when an interior hydrogen pressure of between 0.1 and 0.5 atmospheres is reached in the case.

In accordance with the apparatus of the invention there is provided an encapsulation for a component, comprising a base plate, a case with a low hydrogen permeability at the maximal temperature permitted for the component, the case being vacuum welded to the base plate closing off the base plate and tempered in a hydrogen-containing atmosphere, a raised portion integral with the base plate inside the case, a plurality of lead-in lines passing through holes formed in the base plate and raised portion, glass beads disposed between the lead-in lines and the base plate and raised portion in the holes, and gold wires connected from the lead in lines to aluminum surfaces of the component in the case before the case is closed.

In accordance with a concomitnat feature of the invention there is provided a hydrogen barrier layer disposed on the case formed of at least one of the group consisting of copper being 2 to 4 $\mu$m thick and tin being 6 to 10 $\mu$m thick, and wherein the case is formed of one of the group consisting of nickel-compound, copper, aluminum and nickel, the vacuum is less than $10^{-2}$ Torr, and the tempering is done between 150° and 350° C. and is discontinued when an interior hydrogen pressure of between 0.1 and 0.5 atmospheres is reached in the case.

Other features which are considered as characteristic for the invention are set forth in the appended claims.

Although the invention is illustrated and described herein as embodied in a method for encapsulating components with cases and an encapsulation provided by the method, it is nevertheless not intended to be limited to the details shown, since various modifications and structural changes may be made therein without departing from the spirit of the invention and within the scope and range of equivalents of the claims.

Figure 2:
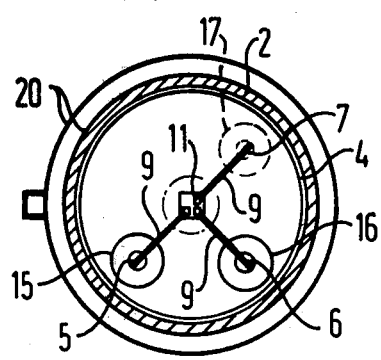

The construction and method of operation of the invention, however, together with additional objects and advantages thereof will be best understood from the following description of specific embodiments when read in connection with the accompanying drawings, in which:

FIG. 1 is a diagrammatic cross-sectional view of a case according to the invention; and FIG. 2 is a cross-sectional view of a case taken along the line II—II in FIG. 1, in the direction of the arrows.

Referring now to the figures of the drawing as a whole, it is seen that a cap 2, formed of an alloy of copper, nickel, and zinc, i.e. of nickel silver which is also known as German silver, is welded with a welding seam 3 to a base-plate 1 made of an alloy of iron-nickel or iron-nickel-cobalt. The cap may also be made of nickel, copper or aluminum. The base plate 1 has a raised portion 4 of the same material as the base plate 1. Three lead-in lines or terminals 5, 6, 7 are brought in through the base plate 1 and the raised portion 4, and are insulated from the base plate 1 and the raised portion 4 by glass beads 15, 16, and 17. Disposed on the raised portion 4 is a semiconductor component such as a transistor 8. The contacts 11 of the transistor 8 are connected with the lead-in lines 5, 6, and 7 by gold wires 9. Obviously, the base plate 1 and the raised portion 4 can also be made of the same material as the cap 2.

The method of the invention is carried out as follows:

First the gold wires 9 are connected with the aluminum contacts 11 of the transistor 8 by soldering. Then the cap 2 is welded to the base plate 1 by means of the welding seam 3. Finally, the case is tempered in a hydrogen-containing atmosphere at 150° to 350° C., until a hydrogen-interior pressure of 0.1 to 0.5 atm. is reached. The welding is performed in a vacuum, which is less than $10^{-2}$ Torr.

The case can be provided with a hydrogen-barrier layer 20 at its inside or outside, which preferably is a galvanically-produced copper-tin double layer. The thickness of this barrier-layer is 2 to 4 $\mu$m for the copper, and 6 to 10 $\mu$m for the tin, thus 8 to 14 $\mu$m altogether.

There are claimed:

1. Encapsulation for a semiconductor component, comprising a base plate, a case with a low hydrogen permeability at the maximal temperature permitted for the component, said case being vacuum-welded to said base plate closing off said base plate and tempered in a hydrogen-containing atmosphere, a hydrogen atmosphere disposed in said case after tempering, a raised portion integral with said base plate inside said case, a plurality of lead-in lines passing through holes formed in said base plate and raised portion, glass beads disposed between said lead-in lines and said base plate and raised portion in said holes, and gold wires connected from said lead in lines to aluminum surfaces of the component in said case before said case is closed.

2. Encapsulation according to claim 1, including a hydrogen barrier layer disposed on said case to prevent hydrogen from diffusing out of said case after tempering, said hydrogen barrier layer being formed of at least one of the group consisting of copper being 2 to 4 $\mu$m thick and tin being 6 to 10 $\mu$m thick, and wherein said case is formed of one of the group consisting of nickel-compound, copper, aluminum and nickel, the vacuum is less than $10^{-2}$ Torr, and the tempering is done between 150° and 350° and is discontinued when an interior hydrogen pressure of between 0.1 and 0.5 atmospheres is reached in the case.

3. Method for encapsulating components in cases while preventing or reducing intermetallic gold-aluminum phases in semiconductor components, which comprises connecting a gold wire to an aluminum surface of a semiconductor component, subsequently closing the case by welding in a vacuum, and tempering the case in a hydrogen-containing atmosphere after welding, to develop a hydrogen atmosphere in the case by diffusion.

4. Method according to claim 1, which comprises disposing a hydrogen barrier layer on the case to prevent hydrogen from diffusing out of the case after tempering.

5. Method according to claim 3, which comprises forming the case out of a material with a low hydrogen permeability at the maximal temperature permitted for the component.

6. Method according to claim 4, which comprises forming the hydrogen barrier layer out of at least one of copper and tin.

7. Method according to claim 6, which comprises forming the barrier layer with a thickness of from 2 to 4 $\mu$m copper and from 6 to 10 $\mu$m tin.

8. Method according to claim 5, which comprises forming the case of one of the group consisting of a nickel-compound, copper and aluminum.

9. Method according to claim 3, which comprises adjusting the vacuum to less than $10^{-2}$ Torr.

10. Method according to claim 3, which comprises forming the case of one of the group consisting of nickel and a nickel-compound.

11. Method according to claim 3, which comprises adjusting the temperature during tempering to between 150° and 350° C.

12. Method according to claim 1, which comprises discontinuing the tempering when an interior hydrogen pressure of between 0.1 and 0.5 atmospheres is reached in the case.

* * * * *